(12) United States Patent
Liu et al.

(10) Patent No.: US 7,343,501 B2
(45) Date of Patent: Mar. 11, 2008

(54) POWER-SAVING DEVICE FOR NOTEBOOK COMPUTER

(75) Inventors: Chun-Hu Liu, Tao Yuan Shien (TW); Yung-Sheng Tsao, Taipei (TW)

(73) Assignee: Quanta Computer Inc., Tao Yuan Shien (TW)

( * ) Notice: Subject to any disclaimer, the term of this patent is extended or adjusted under 35 U.S.C. 154(b) by 386 days.

(21) Appl. No.: 11/122,896

(22) Filed: May 5, 2005

(65) Prior Publication Data
US 2006/0129857 A1    Jun. 15, 2006

(30) Foreign Application Priority Data
Dec. 14, 2004    (TW) ................. 93138717 A

(51) Int. Cl.
*G06F 1/00* (2006.01)
(52) U.S. Cl. .................. 713/310; 713/300; 713/320; 713/324
(58) Field of Classification Search ............ 713/300, 713/310, 320, 324
See application file for complete search history.

(56) References Cited

U.S. PATENT DOCUMENTS

| | | | |
|---|---|---|---|
| 6,549,490 B1 * | 4/2003 | Howarth | 369/30.27 |
| 6,763,473 B1 * | 7/2004 | Oteki et al. | 713/324 |
| 7,073,077 B1 * | 7/2006 | Gavlik | 713/300 |
| 7,203,771 B2 * | 4/2007 | Cho | 710/5 |
| 2003/0051178 A1 * | 3/2003 | Liu | 713/300 |
| 2003/0221135 A1 * | 11/2003 | Motoe et al. | 713/300 |
| 2005/0010829 A1 * | 1/2005 | Choi et al. | 713/300 |
| 2005/0237036 A1 * | 10/2005 | Nguyen et al. | 323/247 |
| 2005/0262367 A1 * | 11/2005 | Shih | 713/323 |

FOREIGN PATENT DOCUMENTS

| | | |
|---|---|---|
| CN | 2538086 | 2/2003 |
| JP | 06266480 | 9/1994 |

* cited by examiner

*Primary Examiner*—Thomas Lee
*Assistant Examiner*—Jaweed A Abbaszadeh
(74) *Attorney, Agent, or Firm*—Thomas, Kayden, Horstemeyer & Risley

(57) ABSTRACT

A power-saving device implemented as a circuit design for a notebook computer comprises a power supply providing power to notebook computer, a built-in device, a control circuit connecting between the power supply and the built-in device, and a switch connecting to the power supply and the built-in device. The switch includes an electric control switch and a manual control switch. When the built-in device is temporarily idle, a user presses the switch to turn off the power of the built-in device via a control circuit to save power.

5 Claims, 4 Drawing Sheets

POWER-SAVING DEVICE FOR NOTEBOOK COMPUTER

BACKGROUND

The invention relates to a power-saving device for a notebook computer, and in particular to a built-in power control device in the notebook computer.

The advantages of a notebook computer are portability and convenience. Because a user cannot find a power outlet in all circumstances, battery life and power management are critical features in notebook computers.

Conventionally, a notebook computer idles when not in use to save power. When the notebook computer proceeds to work, it wakes from the idle state. Referring to FIG. 1, the power supply 30 is electrically connected to the control circuit 35 and the built-in device 33. The built-in device 33 is electrically connected to the control circuit 35. When the notebook computer idles, the power supply 30 provides low voltage to keep the notebook computer turned on without processing data.

SUMMARY

An embodiment of the invention provides a power-saving device for a notebook computer comprising a power supply, a built-in device, a switch, and a control circuit. The power supply provides power for the notebook computer. The switch is electrically connected between the power supply and the built-in device. The control circuit electrically connects to the switch, the power supply and the built-in device. The switch is open or closed to control the control circuit. The control circuit controls the built-in device such that the built-in device is or is not electrically connected to the power supply.

Another embodiment of the invention further comprises an integrated drive electronics interface (IDE) controller and an IDE bus. The IDE controller comprises a high impedance signal and a reverting signal. The high impedance signal raises impedance of the built-in device and the reverting signal reduces impedance of the built-in device. The IDE bus electrically connects to the built-in device and the IDE controller, and transmits the high impedance signal and the reverting signal. When the switch is closed, the IDE controller generates the high impedance signal. When the switch is open, the IDE controller generates the reverting signal. When turning off the power of the built-in device, the high impedance signal and the reverting signal protect the circuit of the built-in device. The leakage of power does not occur such that the built-in device is not damaged.

BRIEF DESCRIPTION OF THE DRAWINGS

The invention can be more fully understood by reading the subsequent detailed description in conjunction with the examples and references made to the accompanying drawings, wherein.

DETAILED DESCRIPTION

Figure 1:
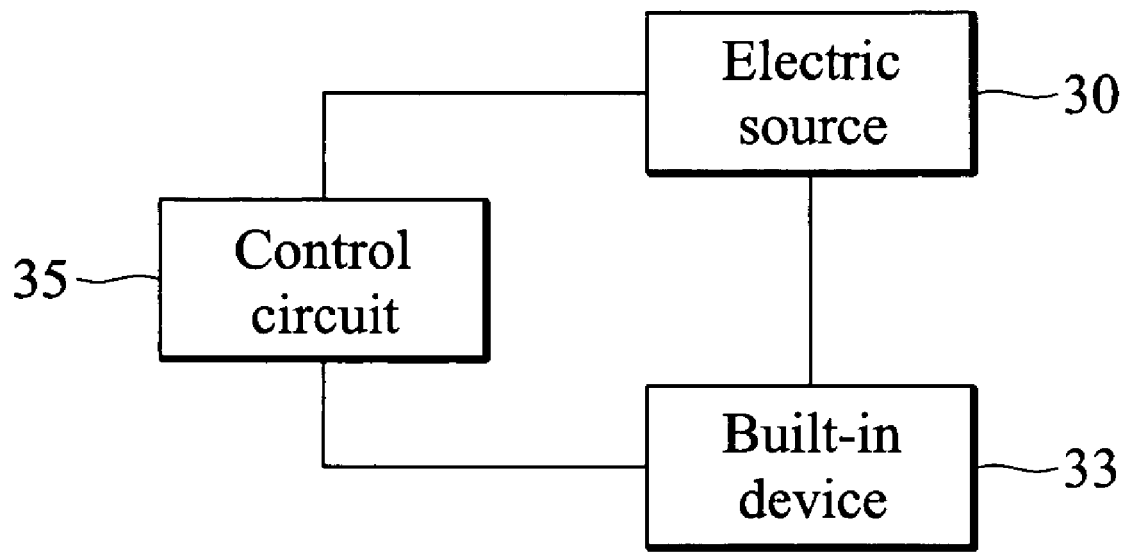
FIG. 1 is block diagram of a conventional notebook computer.
Figure 2:
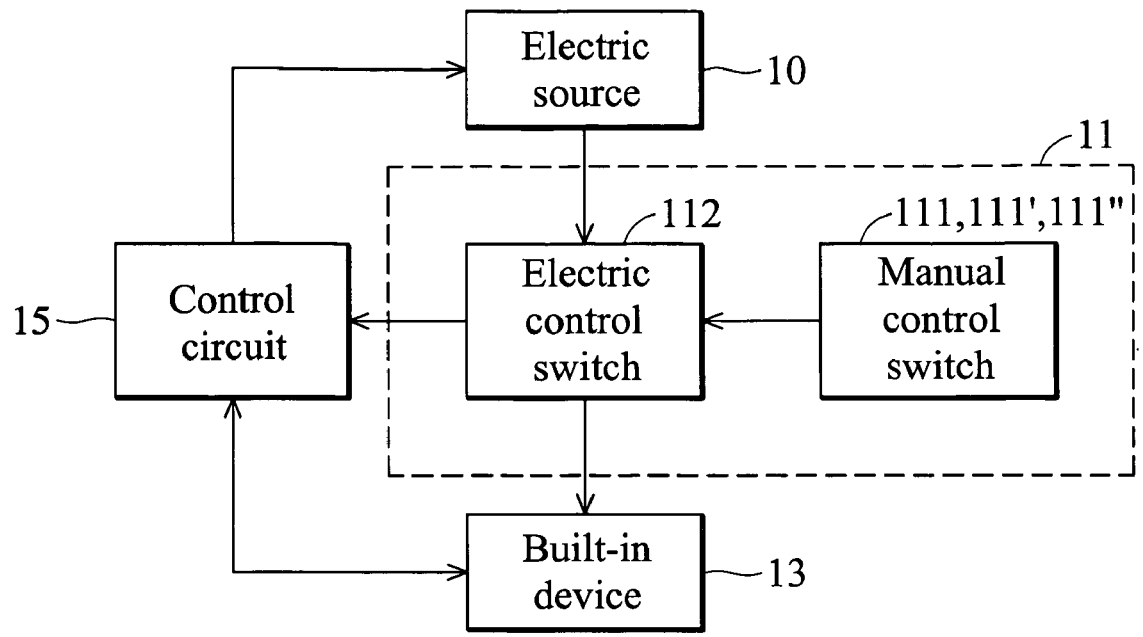
FIG. 2 is a block diagram of an embodiment of notebook computer.
Figure 3:
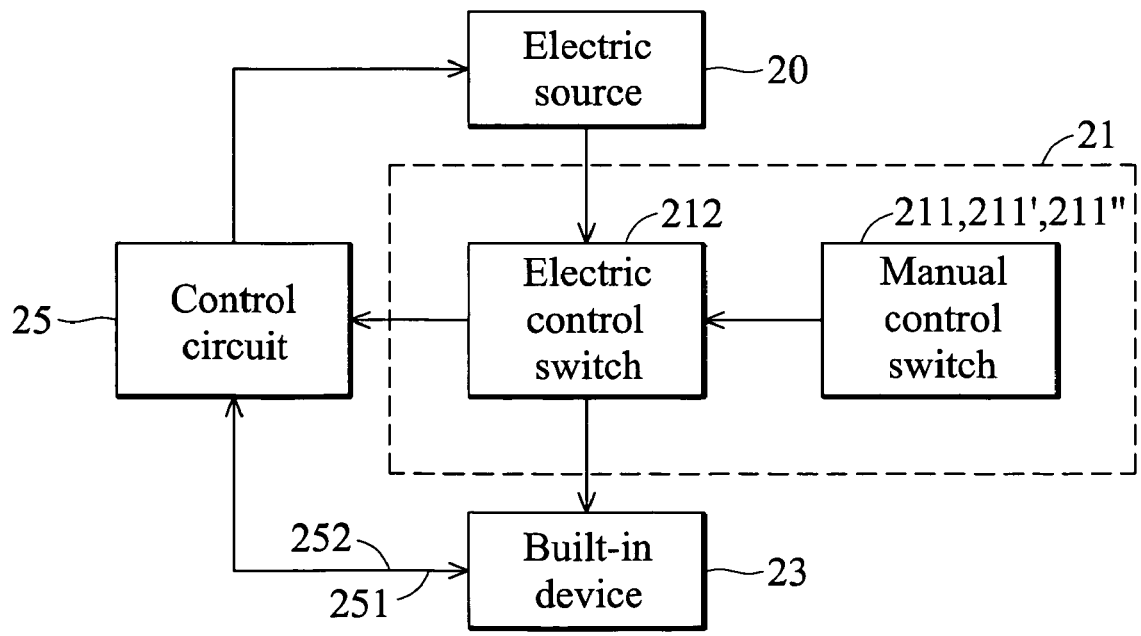
FIG. 3 shows is a block diagram of another embodiment of a notebook computer.
Figure 4A:
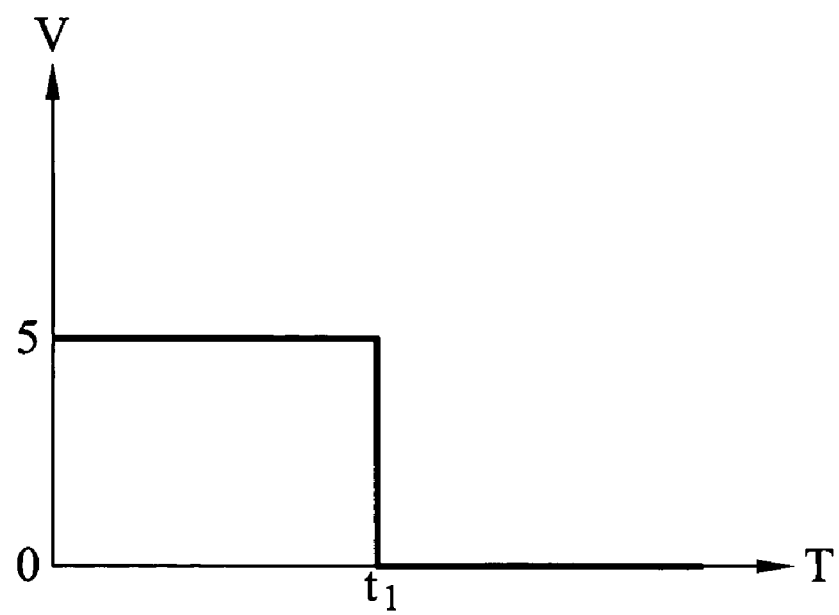
FIG. 4a is the relationship between voltage and time.
Figure 4B:
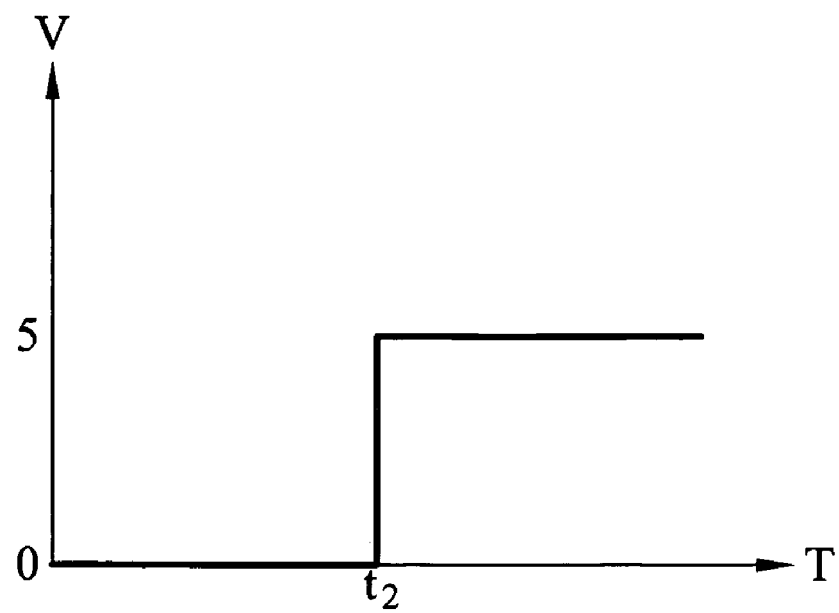
FIG. 4b is the relationship between voltage and time.

Referring to FIG. 2, the power-saving device comprises a switch 11, a control circuit 15, a power supply 10 and a built-in device 13. The switch 11 controls power of the built-in device 13 in the notebook computer and electrically connects to the power supply 10 and the built-in device 13. The switch 11 comprises a manual control switch 111 and an electric control switch 112. The manual control switch 111 is an input element installed on the notebook computer for controlling the electric control switch 112. The control circuit 15 is a central processing unit in the notebook computer and is electrically connected between the power supply 10 and the built-in device 13. The built-in device 13 is a CD-ROM drive, a Bluetooth device or similar.

Figure 5:
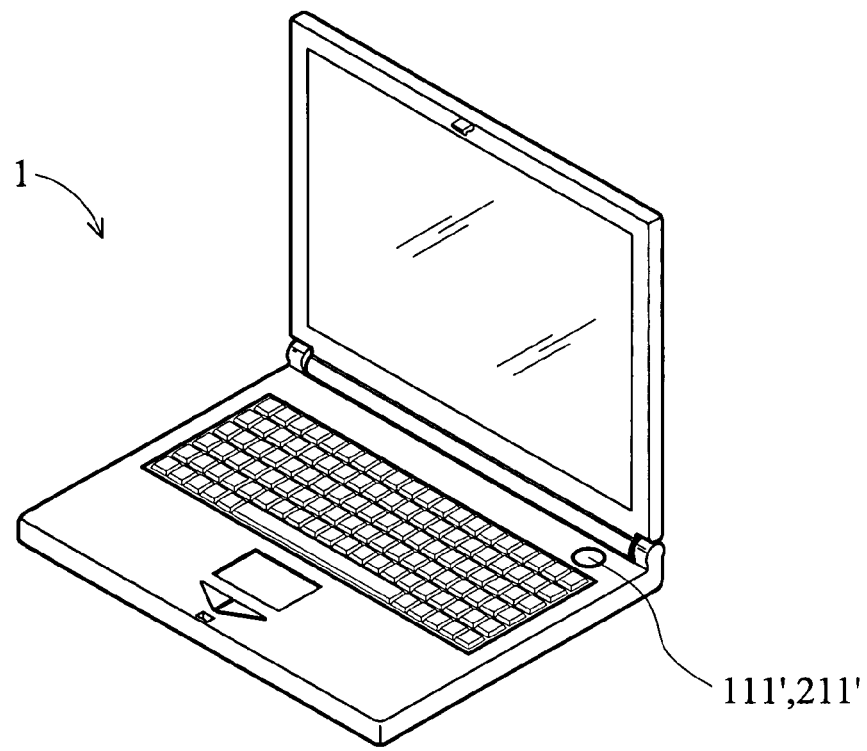
FIG. 5 is a schematic structure of a manual control of a notebook computer.
Figure 6:
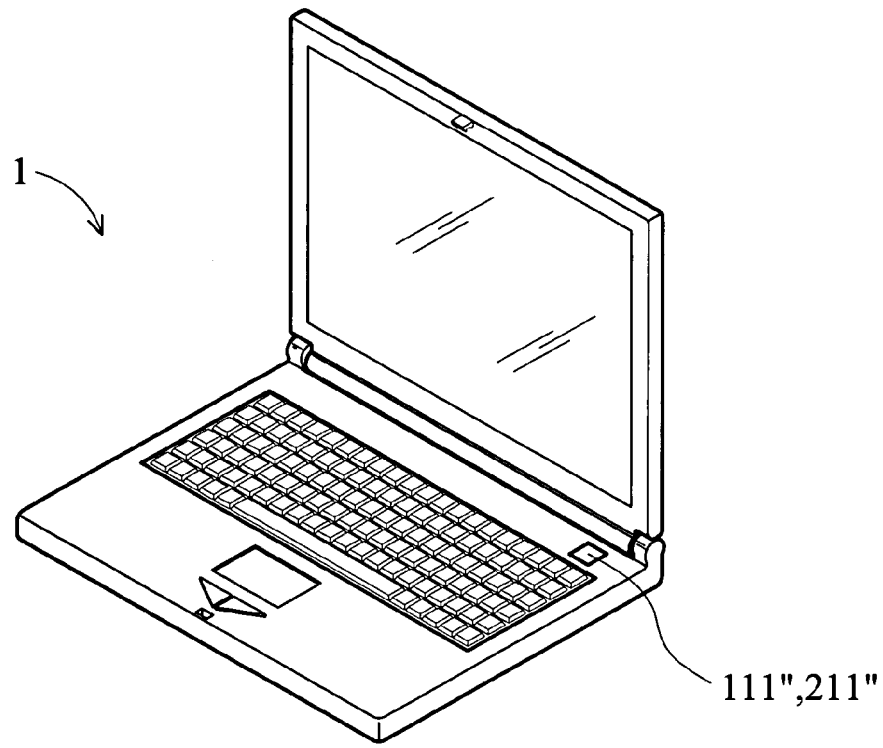
FIG. 6 is a schematic structure of a manual control of a notebook computer.

When use of the built-in device 13 is temporarily suspended, the manual control switch 111 is turned off by a user. The manual control switch 111 sends a close signal to the electric control switch 112. The electric control switch 112 directs the control circuit 15 to not supply power to the built-in device 13. The portion of the notebook computer other than the built-in device 13 still operates normally. When a user needs to use the built-in device 13, the manual control switch 111 is turned on. The manual control switch 111 sends an open signal to the electric control switch 112. The electric control switch 112 commands the control circuit 15 to supply power to the built-in device 13. The electric control switch 112 of this embodiment is a MOSFET. Referring to FIG. 5, the manual control switch 111' is a button or the like. Referring to FIG. 6, the manual control switch 111" is a button or similar.

Referring to FIGS. 3, 4a, 4b and 5, anther embodiment of the power-saving device comprises a switch 21, a control circuit 25, a power supply 20 and a built-in device 23. The switch 21 controls power of the built-in device 23 in the notebook computer and electrically connects to the power supply 20 and the built-in device 23. The switch 21 comprises a manual control switch 211 and an electric control switch 212. The manual control switch 211 is an input installed on the notebook computer for controlling the electric control switch 212. The control circuit 25 is a central processing unit in the notebook computer and electrically connects to the power supply 20 and the built-in device 23. The built-in device 23 is a CD-ROM drive, a Bluetooth device or similar.

The control circuit 25 comprises an integrated drive electronics interface (IDE) controller and an IDE bus. When use of the built-in device 13 is temporarily suspended, the manual control switch 211 is turned off by a user. The manual control switch 211 sends a close signal to the electric control switch 212. The electric control switch 212 controls the control circuit 25. The IDE controller of the control circuit 25 sends a high impedance signal 251 to the built-in device 23 via the IDE bus. When receiving the high impedance signal 251, the built-in device 23 raises impedance. The electric control switch 212 then cuts off power to the built-in device 23 from the power supply 20 at time $t_1$ depicted in FIG. 4a. The voltage of the built-in device 23 decreases from 5V to 0V. This design ensures that the notebook computer will not leak electricity preventing damage to the built-in device 23. Conversely, when a user uses the built-in device 23, the manual control switch 211 is turned on. The manual control switch 211 sends an open signal to the electric control switch 212. The electric control switch 212 commands the control circuit 25 to supply power to the built-in device 23 via power supply 20 at time $t_2$ depicted in FIG. 4*b*. The voltage of the built-in device 23 increases from 0V to 5V. The IDE controller of the control circuit 25 then sends a reverting signal 252 to the built-in device 23 via the IDE bus. This design ensures that the notebook computer will not leak power preventing damage to the built-in device 23 when the built-in device 23 connects to a portion of the notebook computer other than the built-in device 23. Referring to FIG. 5, the manual control switch 211' is a button or similar. Referring to FIG. 6, the manual control switch 211" is a button or similar.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A power-saving device for a notebook computer, comprising:
   a power supply supplying power to the notebook computer;
   a built-in device disposed in the notebook computer;
   a switch electrically connecting to the power supply and the built-in device;
   a control circuit connecting to the switch, the power supply and the built-in device, whereby the control circuit commands the power supply to supply the built-in device with power when the switch is on, and no power when off; and
   an IDE controller to generate signals comprising a high impedance signal to raise impedance in the built-in device and a reverting signal to reduce impedance in the built-in device, and an IDE bus to transmit the high impedance signal and the reverting signal.

2. The power-saving device for the notebook computer as claimed in claim 1, wherein the switch comprises a manual control switch and an electric control switch connecting to the manual control switch.

3. The power-saving device for the notebook computer as claimed in claim 1, wherein the electric control switch is a MOSFET.

4. The power-saving device for the notebook computer as claimed in claim 2, wherein the manual control switch is a key.

5. The power-saving device for the notebook computer as claimed in claim 2, wherein the manual switch is a button.

* * * * *